United States Patent
Xie et al.

(10) Patent No.: US 9,055,684 B2
(45) Date of Patent: Jun. 9, 2015

(54) CONTACT PIECE OF GOLD FINGER, GOLD FINGER AND CONNECTOR COMPRISING THE GOLD FINGER

(75) Inventors: Bingbin Xie, Shenzhen (CN); Daocheng Pang, Shenzhen (CN)

(73) Assignees: Shenzhen BYD Auto R&D Company Limited, Shenzhen (CN); BYD Company Limited, Shenzhen (CN)

( * ) Notice: Subject to any disclaimer, the term of this patent is extended or adjusted under 35 U.S.C. 154(b) by 249 days.

(21) Appl. No.: 13/575,921

(22) PCT Filed: Jan. 17, 2011

(86) PCT No.: PCT/CN2011/070340
§ 371 (c)(1),
(2), (4) Date: Jul. 27, 2012

(87) PCT Pub. No.: WO2011/091730
PCT Pub. Date: Aug. 4, 2011

(65) Prior Publication Data
US 2012/0302111 A1    Nov. 29, 2012

(30) Foreign Application Priority Data

Jan. 29, 2010  (CN) .................. 2010 2 0109297 U (51) Int. Cl.
  *H01R 9/24*   (2006.01)
  *H05K 1/11*   (2006.01)
  *H01R 13/03*  (2006.01)
  *H01R 13/04*  (2006.01)
  *H01R 13/11*  (2006.01)

(52) U.S. Cl.
  CPC ............... *H05K 1/117* (2013.01); *H01R 13/03* (2013.01); *H01R 13/04* (2013.01); *H01R 13/113* (2013.01); *H05K 2201/09409* (2013.01); *H05K 2201/09709* (2013.01); *H05K 2201/09381* (2013.01)

(58) Field of Classification Search
  USPC ................... 439/887, 884, 885, 660
  See application file for complete search history.

(56) References Cited

U.S. PATENT DOCUMENTS

| | | | | |
|---|---|---|---|---|
| 3,765,076 A * | 10/1973 | Brandt | ........................... | 29/860 |
| 5,040,993 A * | 8/1991 | Krug et al. | ...................... | 439/75 |
| 5,575,690 A * | 11/1996 | Eaton | ............................ | 439/717 |
| 6,994,563 B2 * | 2/2006 | Amini et al. | .................... | 439/62 |
| 6,997,727 B1 * | 2/2006 | Legrady et al. | ............... | 439/246 |
| 7,018,224 B2 * | 3/2006 | Reisinger et al. | ............. | 439/181 |

(Continued)

FOREIGN PATENT DOCUMENTS

| | | |
|---|---|---|
| CN | 201066956 | 5/1928 |
| CN | 201657501 | 11/2010 |

OTHER PUBLICATIONS

BYD Company Limited., International Search Report and Written Opinion, PCT/CN2011/070340, Apr. 28, 2011, 8 pages.

*Primary Examiner* — Neil Abrams
*Assistant Examiner* — Travis Chambers
(74) *Attorney, Agent, or Firm* — Morgan, Lewis & Bockius LLP (57) ABSTRACT

A contact piece of a gold finger comprises: a first main body segment; a second main body segment; and a transition segment connected to the first main body segment and the second main body segment, respectively, in a vertical direction, in which an upper edge and a lower edge of the transition segment are inclined with respect to a lateral direction respectively. A gold finger and a connector comprising the same are also provided.

9 Claims, 6 Drawing Sheets

(56) References Cited

U.S. PATENT DOCUMENTS

| | | | |
|---|---|---|---|
| 7,247,057 B2* | 7/2007 | Matsuo et al. | 439/660 |
| 7,374,451 B2* | 5/2008 | Wei et al. | 439/495 |
| 7,455,531 B2* | 11/2008 | Hirabayashi et al. | 439/67 |
| 7,771,205 B2* | 8/2010 | Shiramizu et al. | 439/60 |
| 8,292,672 B2* | 10/2012 | Chou et al. | 439/660 |
| 8,641,453 B2* | 2/2014 | Jung et al. | 439/637 |
| 2006/0094308 A1* | 5/2006 | Chen | 439/884 |
| 2009/0093136 A1* | 4/2009 | Hiew et al. | 439/55 |
| 2009/0233459 A1* | 9/2009 | Shiramizu et al. | 439/60 |
| 2012/0156938 A1* | 6/2012 | Zhang | 439/660 |

* cited by examiner

CONTACT PIECE OF GOLD FINGER, GOLD FINGER AND CONNECTOR COMPRISING THE GOLD FINGER

CROSS-REFERENCE TO RELATED APPLICATIONS

The application is a United States National Stage Application filed under 35 U.S.C §371 of PCT Patent Application Serial No. PCT/CN2011/070340 filed on Jan. 17, 2011 which claims priority to and benefits of Chinese Patent Application No. 201020109297.2, filed with the State Intellectual Property Office of the People's Republic of China (SIPO) on Jan. 29, 2010.

TECHNICAL FIELD

The disclosure relates to a contact piece of a gold finger, a gold finger and a connector comprising the gold finger.

BACKGROUND ART

The conventional connectors for connecting two circuit boards include board to board connectors, wire to board connectors, and flexible printed circuit board/flexible printed circuit board (FPC/FPC) connectors, in which the FPC/FPC connectors are widely used because of their low cost. The gold fingers adapted to the FPC/FPC connectors are widely used on the flexible printed circuit boards.

Figure 6:
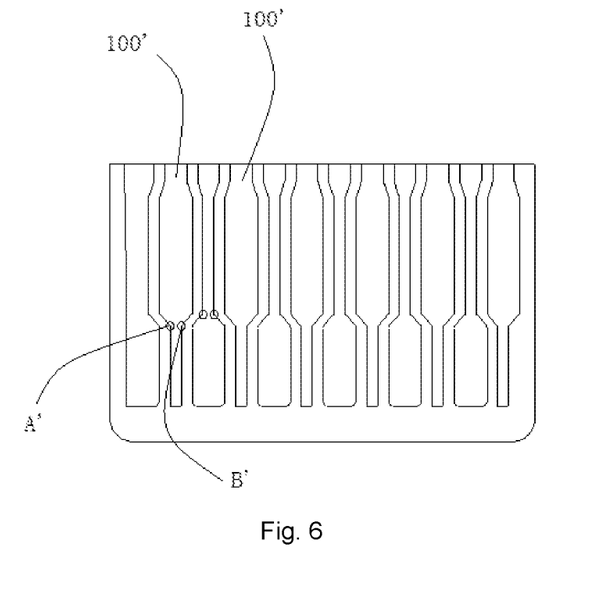
FIG. 6 is a schematic view of a gold finger with symmetric contact pieces in prior art.

The contact pieces of the conventional gold finger are generally symmetric. As shown in FIG. 6, the conventional contact piece 100' is axisymmetric, such that the symmetric contact pieces 100' of the gold finger have weak points A' and B' which are in the same lateral line. Stress may be concentrated on the weak points when plugging and unplugging the good finger, so that the contact pieces may easily break, thus influencing the reliability of the connection and reducing the life of the contact pieces.

SUMMARY OF THE DISCLOSURE

According to a first aspect of the present disclosure, there is provided a contact piece of a gold finger comprising: a first main body segment; a second main body segment; and a transition segment connected to the first main body segment and the second main body segment, transition segment connected to the first main body segment and the second main body segment, respectively, in a vertical direction, in which an upper edge and a lower edge of the transition segment are inclined with respect to a lateral direction respectively.

With the contact piece of a gold finger according to an embodiment of the present disclosure, by employing the asymmetric transition segment, the points at the left and right edges of the contact piece on which the stress is concentrated may be staggered, so that the stress at the weakest points of the contact piece may be reduced, thus improving the capability of the contact piece against the stress damage, ensuring reliability of the connection, and extending the service life of the contact piece.

According to a second aspect of the present disclosure, there is provided a gold finger comprising a plurality of contact pieces spaced apart from each other in a lateral direction. Each contact piece comprises: a first main body segment; a second main body segment; and a transition segment connected to the first main body segment and the second main body segment, respectively, in a vertical direction, in which an upper edge and a lower edge of the transition segment are inclined with respect to the lateral direction respectively.

According to a third aspect of the present disclosure, there is provided a connector comprising: a substrate; and a gold finger comprising a plurality of contact pieces spaced apart from each other in a lateral direction. Each contact piece comprises: a first main body segment; a second main body segment; and a transition segment connected to the first main body segment and the second main body segment, respectively, in a vertical direction, in which an upper edge and a lower edge of the transition segment are inclined with respect to the lateral direction respectively.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Reference will be made in detail to embodiments of the present disclosure. The embodiments described herein with reference to the accompany drawings are explanatory and illustrative, which are used to generally understand the present disclosure. The embodiments shall not be construed to limit the present disclosure. The same or similar elements and the elements having same or similar functions are denoted by like reference numerals throughout the descriptions.

In the description, relative terms such as "right", "left", "lower", "upper", "lateral", "vertical", "up" as well as derivative thereof should be construed to refer to the orientation as then described or as shown in the drawings under discussion. These relative terms are for convenience of description and do not require that the present disclosure be constructed or operated in a particular orientation. Terms concerning "connect" and the like", refer to a relationship wherein structures are secured or attached to one another either directly or indirectly through intervening structures, as well as both movable or rigid attachments or relationships, unless expressly described otherwise.

The contact piece 100 according to an embodiment of the present disclosure will be described below with reference to FIG. 1.

Figure 1:
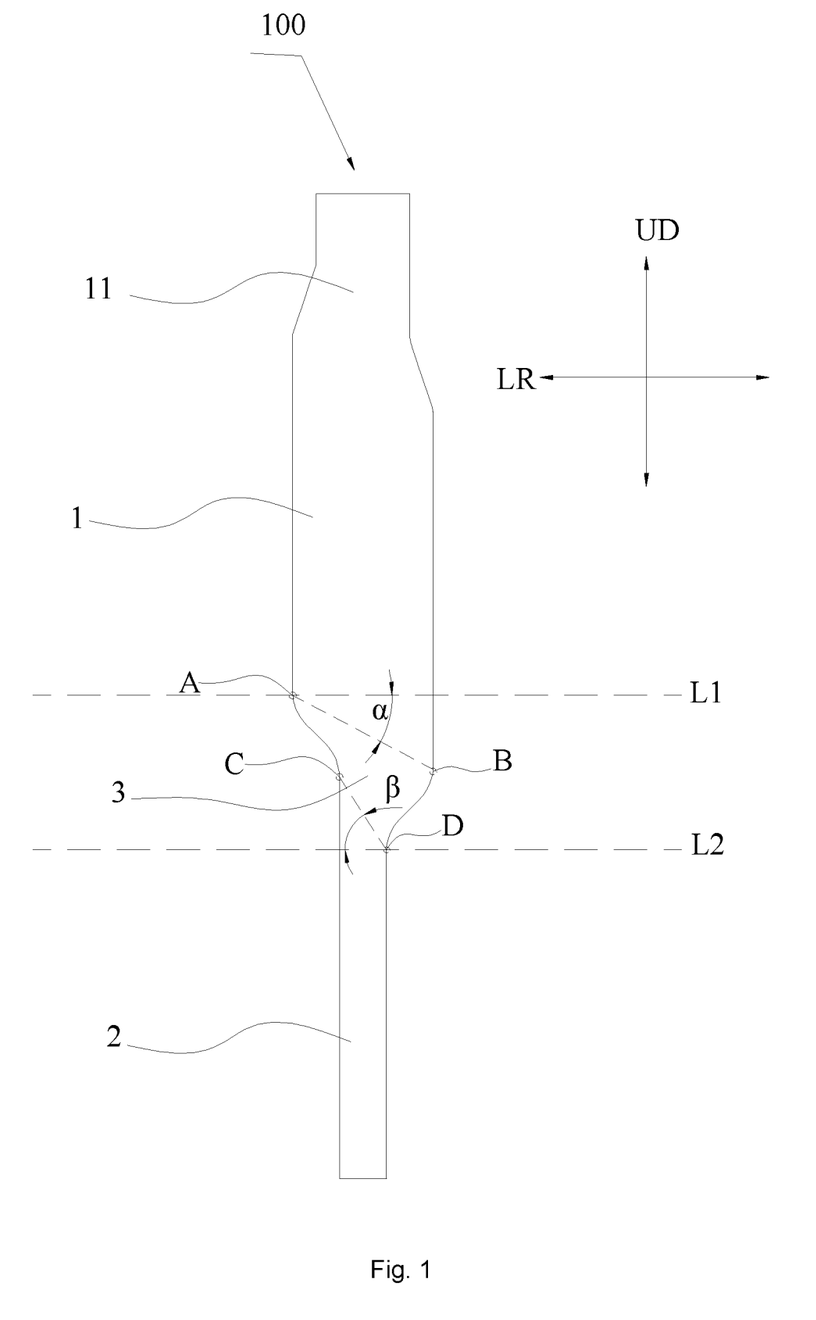
FIG. 1 is a schematic view of a contact piece according to an embodiment of the present disclosure.

As shown in FIG. 1, the contact piece 100 comprises a first main body segment 1, a second main body segment 2 and a transition segment 3.

The transition segment 3 is connected to the first main body segment and the second main body segment, respectively, 1, 2 in an up-down direction labeled as UD in FIG. 1 (i.e., a vertical direction), and an upper edge AB and a lower edge CD of the transition segment 3 are inclined with respect to a left-right direction labeled as LR in FIG. 1 (i.e., a lateral direction) respectively. Therefore, the contact piece 100 according to the embodiment of the present disclosure may be referred to as an asymmetric contact piece which is asymmetric in the vertical direction UD.

The first main body segment 1 is configured to be connected to a circuit board, and the second main body segment 2 is used as an open end portion of the contact piece 100.

In the embodiment shown in FIG. 1, a size (i.e., width) of the first main body segment 1 in the lateral direction LR is greater than that of the second main body segment 2. For example, the width of the second main body segment 2 may be about 0.10-0.2 mm. Because the width of the second main body segment 2 is smaller than that of the first main body segment 1, the stress may concentrate at points C and D of the contact piece 100 when plugging and unplugging the contact piece 100.

Because the upper edge AB and the lower edge CD of the transition segment 3 are inclined with respect to the lateral direction LR, stress concentrating points A and B on the contact piece 100 are staggered in the vertical direction UD, and stress concentrating points C and D are also staggered in the vertical direction UD. Therefore, when plugging and unplugging the contact piece 100, the stress at the contact piece 100 may be dispersed, the stress concentration is decreased, and consequently the contact piece 100 is not easy to break, thus improving reliability of the connection and extending the service life of the contact piece 100.

In some embodiments of the present disclosure, the first main body segment 1, the second main body segment 2, and the transition segment 3 of the contact piece 100 are an integral piece. In this case, a division of the contact piece 100 into the first main body segment 1, the second main body segment 2, and the transition segment 3 is used for the convenience of the description.

As shown in FIG. 1, in some embodiments of the present disclosure, a first angle $\alpha$, i.e., the angle between the upper edge AB and a lateral line L1, is formed between the upper edge AB of the transition segment 3 and the lateral direction LR. A second angle $\beta$, i.e., the angle between the lower edge CD and a lateral line L2, is formed between the lower edge CD of the transition segment 3 and the lateral direction LR, in which $30°<\alpha<70°$, and $30°<\beta<70°$.

In the embodiment shown in FIG. 1, because the width of the second main body segment 2 is smaller than that of the first main body segment 1, $\beta$ is greater than $\alpha$. Therefore, the stress concentration at the contact piece 100 may be further reduced, and consequently the service life of the contact piece 100 may be extended.

As shown in FIG. 1, according to an example of the present disclosure, each of a left edge AC and a right edge BD of the transition segment 3 is a curved line, thus further dispersing the stress at the contact piece 100. For example, each curved edge is formed by a plurality of arc segments, and each arc segment has a radius of about 0.10-0.15 mm.

As shown in FIG. 1, a top portion 11 (i.e., an end portion far away from the transition segment 3) of the first main body segment 1 is non-axisymmetrical with respect to the vertical direction. The length of the top portion 11 of the first main body segment 1 in the vertical direction UD may be determined according to particular applications. Therefore, the stress at the top portion 11 of the first main body segment 1 is dispersed, thus reducing the stress concentration at the top portion 11 of the first main body segment 1, and extending the service life of the contact piece 100.

The contact piece 100 according to another embodiment of the present disclosure will be described below with reference to FIG. 2.

Figure 2:
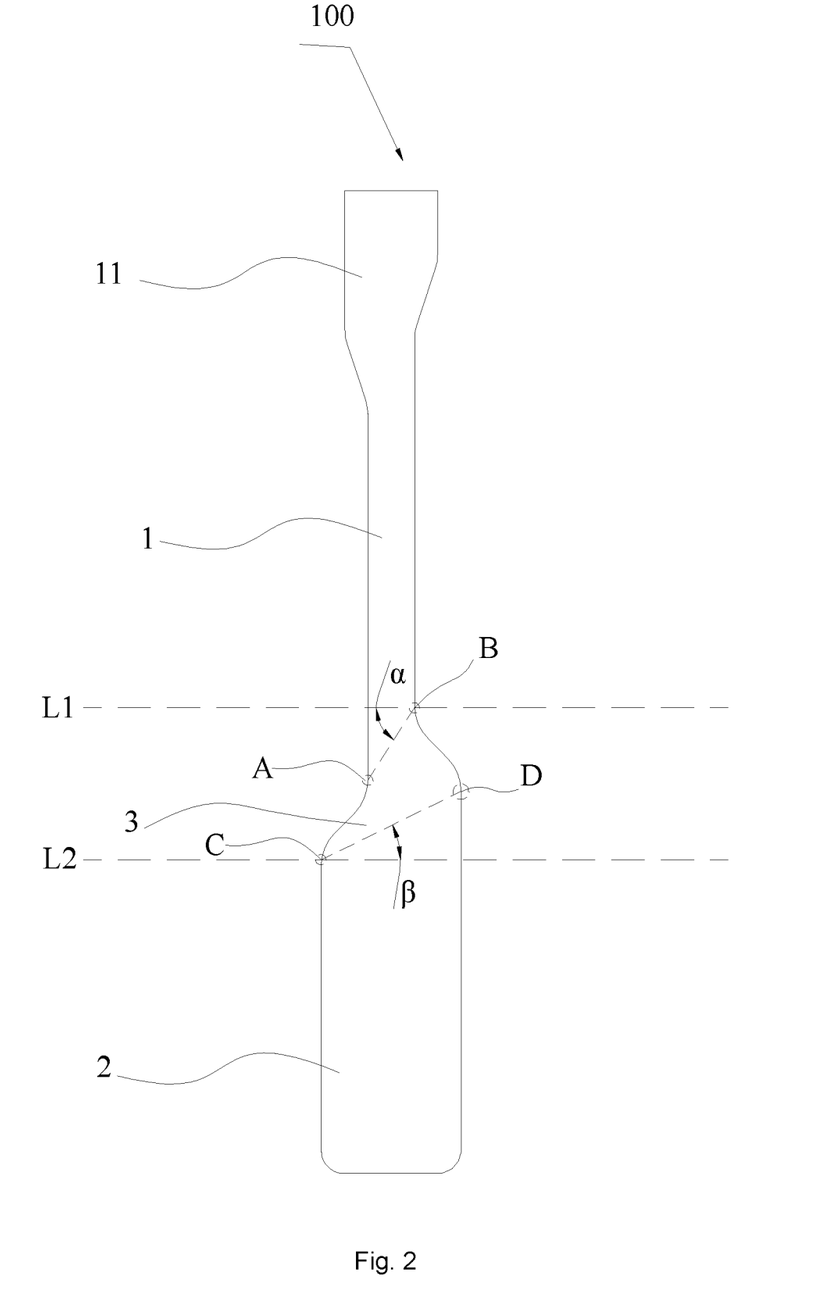
FIG. 2 is a schematic view of a contact piece according to another embodiment of the present disclosure.

As shown in FIG. 2, the width of the first main body segment 1 is smaller than that of the second main body segment 2, so that the stress at the contact piece 100 may concentrate at points A and B on the upper edge AB of the transition segment 3.

Similarly, because the upper edge AB and the lower edge CD of the transition segment are inclined with respect to the lateral direction LR, thus dispersing the stress at the contact piece 100, and extending the service life of the contact piece 100.

Because the width of the first main body segment 1 is smaller than that of the second main body segment 2, $\beta$ is less than $\alpha$. In the embodiment shown in FIG. 2, a top portion 11 of the first main body segment 1 is also non-axisymmetrical with respect to the vertical direction.

The inclination direction of the upper edge AB in the embodiment shown in FIG. 2 is opposite to that of the upper edge AB in the embodiment shown in FIG. 1, and the inclination direction of the lower edge CD in the embodiment shown in FIG. 2 is opposite to that of the lower edge CD in the embodiment shown in FIG. 1. Other structures of the contact piece 100 in the embodiment shown in FIG. 2 may be identical to those of the contact piece 100 in the embodiment shown in FIG. 1, and therefore detailed description thereof is omitted here.

Figure 3:
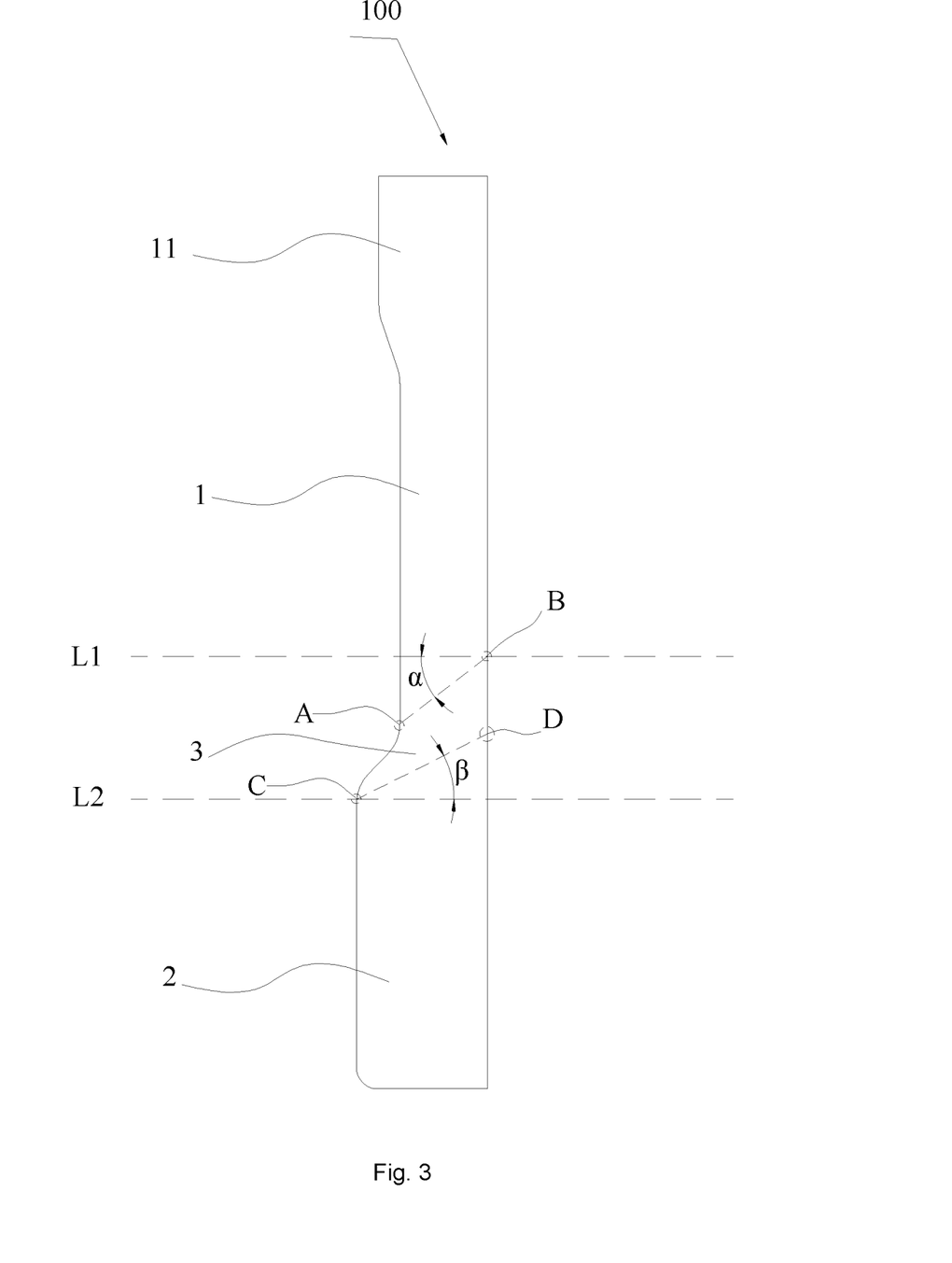
FIG. 3 is a schematic view of a contact piece according to still another embodiment of the present disclosure.

FIG. 3 shows a contact piece 100 according to still another embodiment of the present disclosure. As shown in FIG. 3, a left edge AC of the transition segment 3 is a curved line, and a right edge BD is a straight line. The width of the second main body segment 2 is greater than that of the first main body segment 1, and a top portion 11 of the first main body segment 1 is non-axisymmetrical with respect to the vertical direction.

Figure 4:
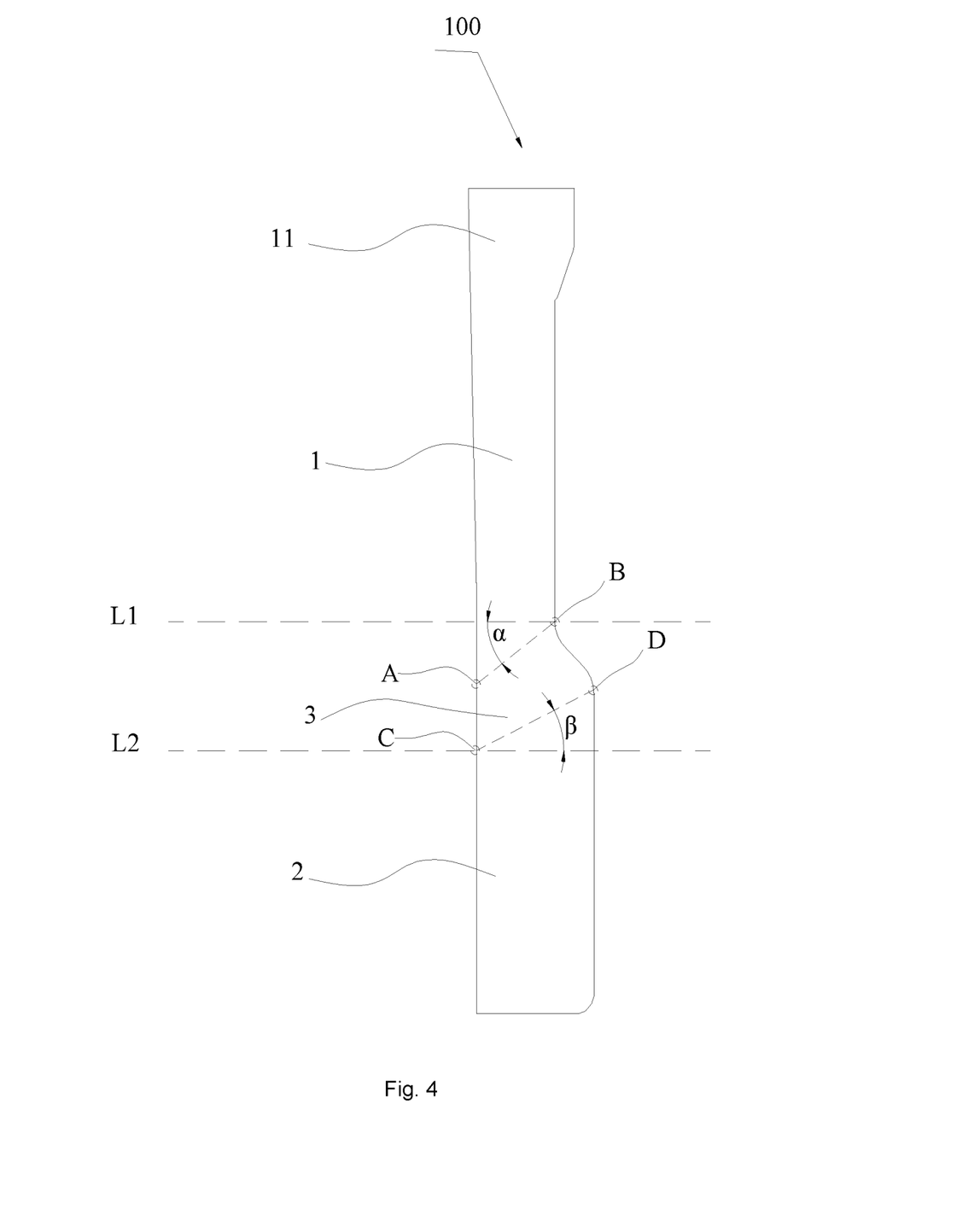
FIG. 4 is a schematic view of a contact piece according to yet another embodiment of the present disclosure.

FIG. 4 shows a contact piece 100 according to yet another embodiment of the present disclosure. As shown in FIG. 4, a left edge AC of the transition segment 3 is a straight line, and a right edge BD is a curved line. The width of the second main body segment 2 is greater than that of the first main body segment 1, and a top portion 11 of the first main body segment 1 is non-axisymmetrical with respect to the vertical direction.

The gold finger according to an embodiment of the present disclosure will be described below with reference to FIG. 5. The gold finger according to an embodiment of the present disclosure comprises a plurality of contact pieces 100 spaced apart from each other in the lateral direction LR, in which the plurality of contact pieces 100 may be those described in the above embodiments.

Figure 5:
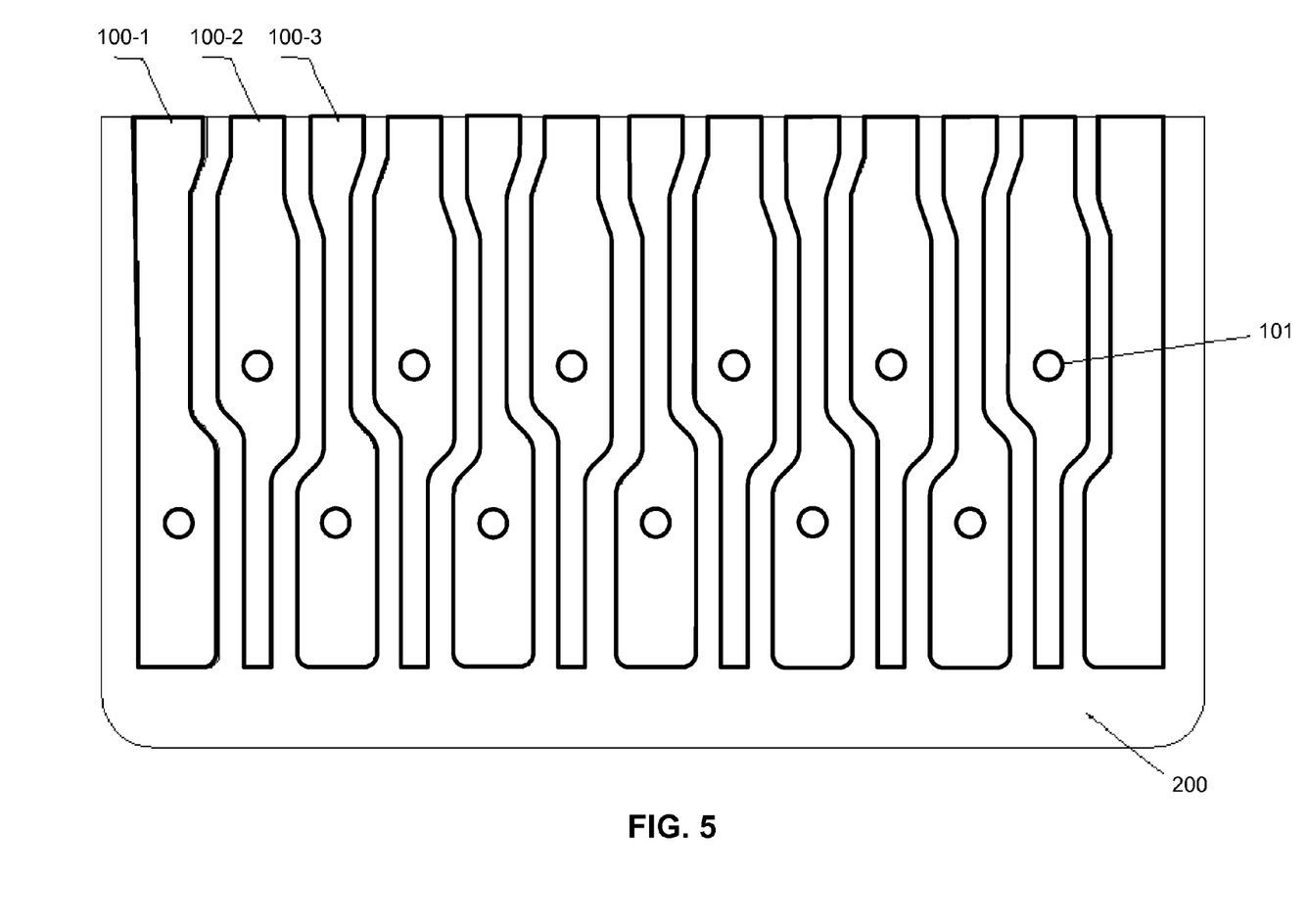
FIG. 5 is a schematic view of a connector according to an embodiment of the present disclosure, which shows a gold finger comprising a plurality of contact pieces according to an embodiment of the present disclosure.

In a specific example of the present disclosure, as shown in FIG. 5, the leftmost contact piece 100-1 is the one described in the embodiment shown in FIG. 4, the rightmost contact piece 100-3 is the one described in the embodiment shown in FIG. 3, and the contact pieces 100-2 between the leftmost contact piece 100-1 and the rightmost contact piece 100-3 are those shown in FIGS. 1-2, in which the contact pieces 100 shown in FIG. 1 and the contact pieces 100 shown in FIG. 2 are disposed alternately.

With the gold finger according to an embodiment of the present disclosure, the stress at each contact piece 100 is dispersed, thus extending the service life of each contact piece 100.

The connector according to an embodiment of the present disclosure will be described below with reference to FIG. 5.

The connector according to an embodiment of the present disclosure comprises a substrate 200 and a gold finger disposed on the substrate 200. The gold finger may be the one described according to the above embodiment. A contact point 101 on each contact piece 100 of the gold finger is configured to be contacted by a corresponding connector.

With the connector according to an embodiment of the present disclosure, the stress at each contact piece 100 of the gold finger is dispersed, and consequently each contact piece 100 may be difficult to break, thus extending the service life of each contact piece 100.

A method for manufacturing the gold finger on a flexible printed circuit board comprising the gold finger according to an embodiment of the present disclosure comprises the following step:

cutting a roll of copper foil into a plurality of copper foil sheets;

laminating a layer of photosensitive material on a surface of the copper foil sheets;

exposing a dry film portion through the sheltering of a pattern film;

washing an unexposed dry film portion with a developing solution;

removing the exposed copper by etching with an etching solution;

peeling a remaining dry film portion with a peeling solution;

laminating a layer of protective film on a surface of a circuit;

hot pressing the layer of protective film to solidify the layer of protective film;

laminating and reinforcing a back surface of the gold finger;

hot pressing and reinforcing the back surface of the gold finger to solidify the back surface of the gold finger;

plating a nickel layer on a surface of the gold finger; and forming a desired article by using a mould.

The method for preparing the flexible printed circuit board is well known to those skilled in the art, and consequently detailed description thereof is omitted here. In this embodiment, the gold finger is used in a FPC/FPC connector.

Test

In order to test the bending performance of the gold finger, the gold finger according to an embodiment of the present disclosure and a conventional gold finger having a symmetric structure as shown in FIG. 6 are plugged into a connector, and then pulled out respectively. The plugging and unplugging are repeated until a crack occurs in the gold finger, and the plugging and unplugging times are recorded in Table 1.

TABLE 1

| Gold Finger | Number of plugging and unplugging times |
| --- | --- |
| Embodiment Of The Present Disclosure | 348 |
| Comparative conventional example | 78 |

It can be seen from Table 1 that, the gold finger according to an embodiment of the present disclosure may be plugged and unplugged 348 times, while the conventional gold finger having a symmetric structure may be only plugged and unplugged 78 times.

Therefore, the stress at the gold finger according to an embodiment of the present disclosure may be effectively dispersed, and consequently the gold finger is not easy to break, thus prolonging the service life of the gold finger.

Reference throughout this specification to "an embodiment", "some embodiments", "an example" or "a specific example" means that a particular feature, structure, material, or characteristic described in connection with the embodiment or example is included in at least one embodiment or example of the disclosure. Thus, the appearances of the phrases such as "in some embodiments" or "in a specific example" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A contact piece of a gold finger, comprising:

a first main body segment;

a second main body segment; and a transition segment connected to the first main body segment and the second main body segment, respectively, in a vertical direction, wherein an upper edge and a lower edge of the transition segment are inclined with respect to a lateral direction respectively, wherein a top portion of the first main body segment is non-axisymmetrical with respect to the vertical direction, wherein the first main body segment, the second main body segment, and the transition segment are located within one plane, and wherein the transition segment has a left edge and a right edge defined between the upper edge and the lower edge, at least one of the left edge and the right edge being curved within the plane.

2. The contact piece of the gold finger according to claim 1, wherein the first main body segment, the second main body segment, and the transition segment are an integral piece.

3. The contact piece of the gold finger according to claim 1, wherein a first angle α is formed between the upper edge of the transition segment and the lateral direction, and a second angle β is formed between the lower edge of the transition segment and the lateral direction, in which 30°≤α≤70°, and 30°<β<70°.

4. The contact piece of the gold finger according to claim 1, wherein the transition segment has the left edge and the right edge, both of which are curved.

5. The contact piece of the gold finger according to claim 1, wherein the transition segment has the left edge and the right edge, one of which is curved and the other of which is straight.

6. The contact piece of the gold finger according to claim 4, wherein each curved edge is formed by a plurality of arc segments.

7. The contact piece of the gold finger according to claim 6, wherein each arc segment has a radius of about 0.10-0.15 mm.

8. A gold finger comprising a plurality of contact pieces spaced apart from each other in a lateral direction, each contact piece comprising:
- a first main body segment;
- a second main body segment; and
- a transition segment connecting the first main body segment and the second main body segment in a vertical direction,
- wherein an upper edge and a lower edge of the transition segment are inclined with respect to the lateral direction respectively,
- wherein a top portion of the first main body segment is non-axisymmetrical with respect to the vertical direction,
- wherein the first main body segment, the second main body segment, and the transition segment are located within one plane, and
- wherein the transition segment has a left edge and a right edge defined between the upper edge and the lower edge, at least one of the left edge and the right edge being curved within the plane.

9. A connector, comprising:
a substrate; and
a gold finger comprising a plurality of contact pieces spaced apart from each other in a lateral direction, each contact piece comprising:
- a first main body segment;
- a second main body segment; and
- a transition segment connecting the first main body segment and the second main body segment in a vertical direction,
- wherein an upper edge and a lower edge of the transition segment are inclined with respect to the lateral direction respectively,
- wherein a top portion of the first main body segment is non-axisymmetrical with respect to the vertical direction,
- wherein the first main body segment, the second main body segment, and the transition segment are located within one plane, and
- wherein the transition segment has a left edge and a right edge defined between the upper edge and the lower edge, at least one of the left edge and the right edge being curved within the plane.

* * * * *